United States Patent
Yuan et al.

(10) Patent No.: US 10,777,142 B2
(45) Date of Patent: Sep. 15, 2020

(54) GATE DRIVE OUTPUT STAGE CIRCUIT, GATE DRIVING UNIT, AND DRIVE METHOD

(71) Applicants: Hefei Xinsheng Optoelectronics Technology Co., Ltd., Hefei (CN); BOE TECHNOLOGY GROUP CO., LTD., Beijing (CN)

(72) Inventors: Zhidong Yuan, Beijing (CN); Can Yuan, Beijing (CN); Yongqian Li, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/424,521

(22) Filed: May 29, 2019

(65) Prior Publication Data
US 2020/0066210 A1    Feb. 27, 2020

(30) Foreign Application Priority Data
Aug. 24, 2018 (CN) .......................... 2018 1 0978079

(51) Int. Cl.
*G11C 19/00* (2006.01)
*G09G 3/3266* (2016.01)
(Continued)

(52) U.S. Cl.
CPC ......... *G09G 3/3266* (2013.01); *G11C 19/287* (2013.01); *H03K 17/6871* (2013.01);
(Continued)

(58) Field of Classification Search
CPC ........... G09G 3/3266; G09G 2300/043; G09G 2300/0426; G11C 19/287; H03K 17/6871
(Continued)

(56) References Cited

U.S. PATENT DOCUMENTS 8,599,110 B2    12/2013  Kim
10,403,195 B2 *  9/2019  Zhu .......................... G09G 3/20
(Continued)

FOREIGN PATENT DOCUMENTS

CN    104332181    2/2015
CN    104392686    3/2015
(Continued)

OTHER PUBLICATIONS

First Office Action in Chinese Patent Application No. 201810978079.3 dated Oct. 24, 2019.

*Primary Examiner* — Ryan Jager
(74) *Attorney, Agent, or Firm* — Thomas | Horstemeyer LLP (57) ABSTRACT

The present disclosure discloses a gate drive output stage circuit, a gate driving unit, and a drive method. The gate drive output stage circuit includes: a first control sub-circuit configured to transmit a start signal of a compensation driving terminal to a first node; a second control sub-circuit configured to transmit a first clock signal of a first clock terminal to a control node when the first node is at an effective level; a first output sub-circuit configured to transmit a second clock signal of a second clock terminal to a first output terminal when the control node is at an effective level; and a second output sub-circuit configured to transmit a first power supply voltage signal of a first power supply voltage terminal to a second output terminal when the control node is at the effective level.

18 Claims, 8 Drawing Sheets

(51) Int. Cl.
*G11C 19/28* (2006.01)
*H03K 17/687* (2006.01)

(52) U.S. Cl.
CPC ............. *G09G 2300/043* (2013.01); *G09G 2300/0426* (2013.01)

(58) Field of Classification Search
USPC .......................................... 327/109; 377/64
See application file for complete search history.

(56) References Cited

U.S. PATENT DOCUMENTS

| | | | | |
|---|---|---|---|---|
| 2018/0068635 A1* | 3/2018 | Zhu | ................... | G09G 5/006 |
| 2018/0090072 A1* | 3/2018 | Sun | ................... | G09G 3/3258 |
| 2018/0254091 A1* | 9/2018 | Zhang | ................ | G11C 19/184 |
| 2018/0330667 A1* | 11/2018 | Yuan | ................. | G09G 3/3258 |
| 2019/0005866 A1* | 1/2019 | Li | ..................... | G11C 19/28 |
| 2019/0066562 A1* | 2/2019 | Hu | ..................... | G09G 3/20 |
| 2019/0066568 A1* | 2/2019 | Wu | .................... | G11C 19/184 |
| 2019/0088190 A1* | 3/2019 | Zhang | ................ | G09G 3/2092 |
| 2019/0139475 A1* | 5/2019 | Wang | ................. | G11C 7/02 |
| 2020/0035315 A1* | 1/2020 | Yuan | ................. | G11C 19/28 |

FOREIGN PATENT DOCUMENTS

| | | |
|---|---|---|
| CN | 104933990 | 9/2015 |
| CN | 105139801 | 12/2015 |
| CN | 105741741 | 7/2016 |
| CN | 106710548 | 5/2017 |

\* cited by examiner

GATE DRIVE OUTPUT STAGE CIRCUIT, GATE DRIVING UNIT, AND DRIVE METHOD

CROSS-REFERENCE TO RELATED APPLICATION

This application is based upon, and claims the benefit of and priority to, Chinese Patent Application No. 201810978079.3, filed on Aug. 24, 2018, the entire contents thereof are incorporated herein by reference.

TECHNICAL FIELD

The present disclosure generally relates to the field of display technologies and, more particularly, to a gate drive output stage circuit, a gate driving unit, and a drive method.

BACKGROUND

Active matrix organic light-emitting diodes (AMOLEDs) are expected to replace LCDs to become mainstream choice for next-generation displays due to their high contrast ratios, wide viewing angles, and high response speeds. OLED products require electroluminescent (EL) devices to emit light, and required light emission currents need to be supplied by Drive TFTs. Therefore, to ensure light emission uniformity of display products, it is necessary to add compensation circuits to ensure the uniformity of characteristics of the devices, and the compensation circuits may adopt external compensation methods to compensate. In traditional external compensation dual-gate driving methods, more clock signals are required, which is disadvantageous when implementing a narrow bezel in a display device.

SUMMARY

In a first aspect, a gate drive output stage circuit is provided, which includes:

a first control sub-circuit, configured to transmit a start signal of a compensation driving terminal to a first node;

a second control sub-circuit, configured to transmit a first clock signal of a first clock terminal to a control node when the first node is at an effective level;

a first output sub-circuit, configured to transmit a second clock signal of a second clock terminal to a first output terminal when the control node is at an effective level; and a second output sub-circuit, configured to transmit a first power supply voltage signal of a first power supply voltage terminal to a second output terminal when the control node is at the effective level.

In a second aspect, a gate driving unit is provided, which includes:

the gate drive output stage circuit according to the first aspect of the present disclosure; and a shift register circuit for frame shifting and a shift register circuit for row shifting which have an identical structure.

The shift register circuit includes:

an input sub-circuit, configured to receive a cascade signal from a previous-stage gate driving unit, and pull a third node to be equal to a voltage of the first power supply voltage terminal under the action of the cascade signal from the previous-stage gate driving unit;

a reset sub-circuit, configured to receive a cascade signal from a next-stage gate driving unit, and reset under the action of the cascade signal from the next-stage gate driving unit;

a reverser sub-circuit, two ends of the first reverser being respectively coupled to the third node and a fourth node; and a cascade output sub-circuit, configured to transmit a third clock signal of a third clock terminal to a cascade output terminal when the third node is at an effective level.

The third node of the shift register circuit for frame shifting is coupled to a gate of a first control transistor of the gate drive output stage circuit, and the third node and the fourth node of the shift register circuit for row shifting are respectively coupled to the first node and the second node of the gate drive output stage circuit.

The third clock terminal of the shift register circuit for row shifting receives the same clock signal as the first clock terminal of the gate drive output stage circuit.

In a third aspect, there is provided a drive method of a gate drive output stage circuit, which includes following steps:

in a first phase, pulling up a first node by a first control sub-circuit under the action of a start signal;

in a second phase, transmitting, by a second control sub-circuit, a first clock signal to a control node under the action of the first node;

in a third phase, transmitting, by a first output sub-circuit, a first power supply voltage signal to a first output terminal under the action of the control node, and transmitting, by a second output sub-circuit, a second clock signal to a second output terminal under the action of the control node.

BRIEF DESCRIPTION OF THE DRAWINGS

Other features, objectives, and advantages of the present disclosure will become more apparent upon reading the detailed description of non-limiting embodiments with reference to the accompanying drawings, wherein.

DETAILED DESCRIPTION

The present disclosure will be further described below in detail in combination with the accompanying drawings and the embodiments. It should be appreciated that the specific embodiments described herein are merely used for explaining the relevant invention, rather than limiting the invention. In addition, it should be noted that, for the ease of description, only the parts related to the invention are shown in the accompanying drawings.

It should also be noted that the embodiments in the present disclosure, and the features in the embodiments, may be combined with each other on a non-conflicting basis. The present disclosure will be described below in detail with reference to the accompanying drawings and in combination with the embodiments.

Figure 1:
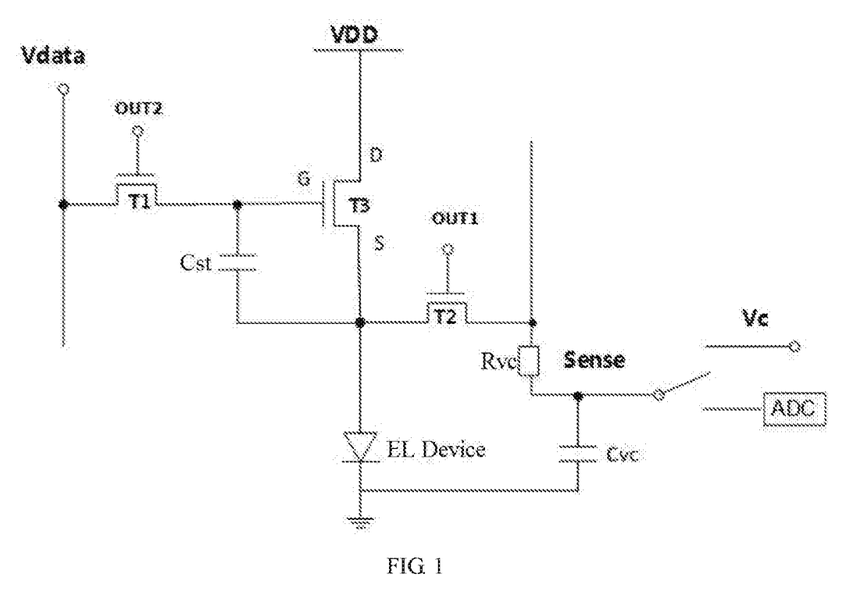
FIG. 1 illustrates a 3T1C external compensation circuit.

Referring to FIG. 1, a 3T1C external compensation circuit is illustrated. As shown in FIG. 1, to implement the uniformity of characteristics of an EL device, in a blanking interval between frames, compensation is implemented by scanning a drive signal OUT1 and a frame drive signal OUT2 and inputting corresponding data.

Figure 2:
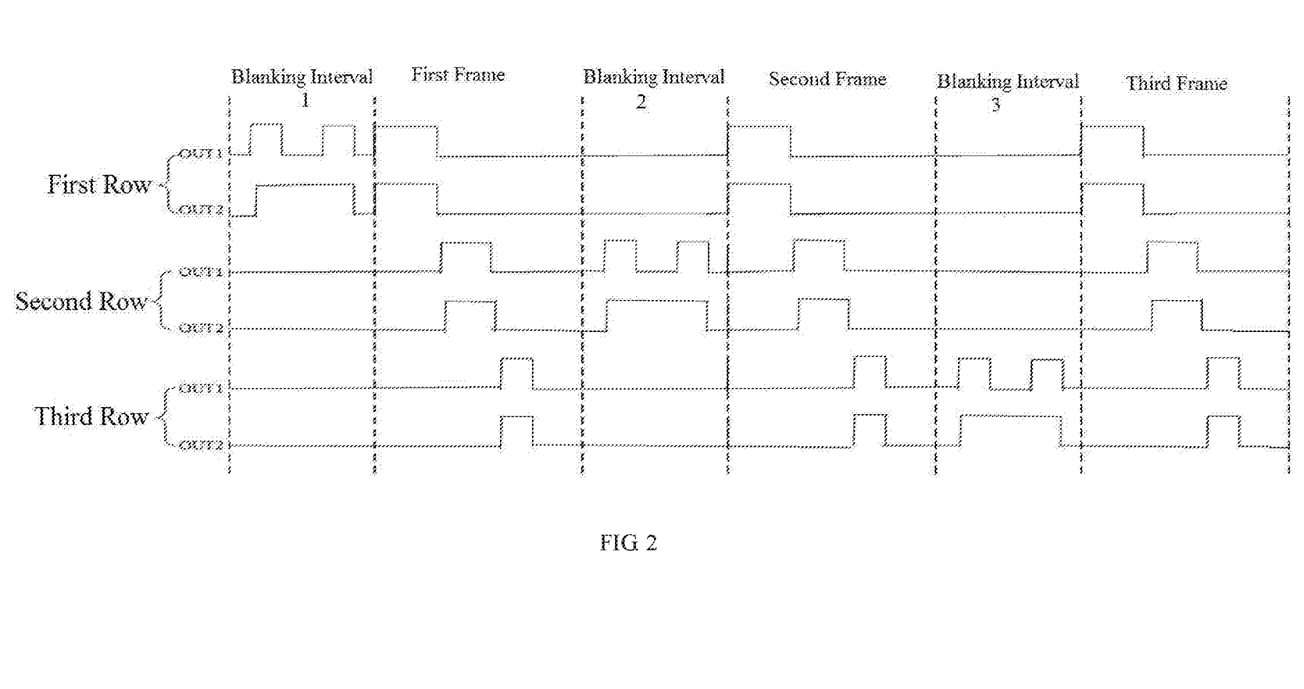
FIG. 2 illustrates a compensation timing chart of the 3T1C external compensation circuit.

FIG. 2 illustrates a timing chart of a scanning signal of the 3T1C external compensation circuit. As can be seen, in the interval where the signal OUT2 is valid, current compensation is implemented by respectively writing corresponding data by starting two OUT1 pulses, thereby achieving the objective of uniformity of light emission of the EL device. FIG. 2 illustrates a timing chart of compensating the first row, the second row, and the third row in the blanking interval 1 before the first frame, in the blanking interval 2 between the first frame and the second frame, and in the blanking interval 3 between the second frame and the third frame, respectively. It is to be noted that FIG. 2 only shows an embodiment of the compensation circuit; it may be planned to compensate with row(s) in a certain blanking interval according to requirements, which is not limited herein.

Figure 3:
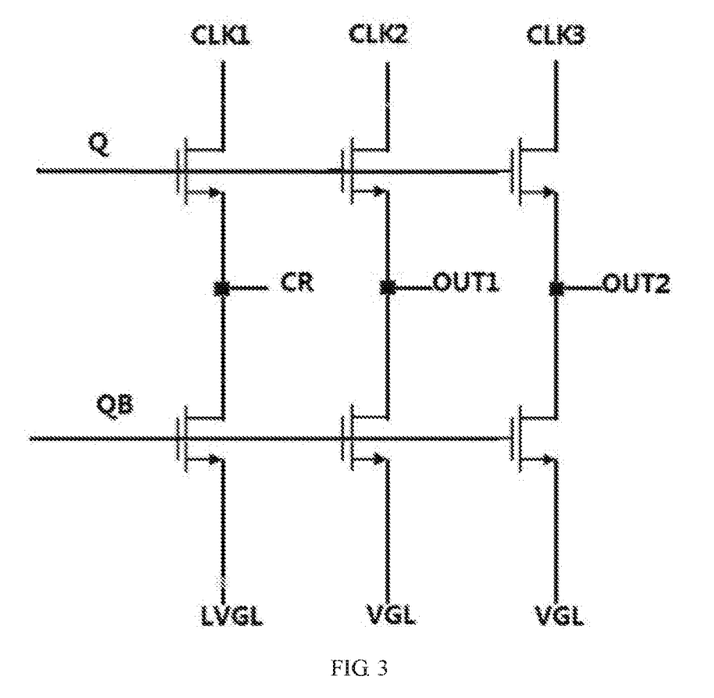
FIG. 3 illustrates a schematic structural block diagram of a gate drive output stage circuit of the prior art.

FIG. 3 illustrates a schematic structural block diagram of a gate drive output stage circuit.

As shown in FIG. 3, the output stage circuit uses three clock pulses, CLK1, CLK2, and CLK3, to output two pulses OUT1 and OUT2 in a valid interval. As can be seen, numerous clock circuits are used in the output stage circuit, which is disadvantageous when implementing a narrow bezel.

Figure 4:
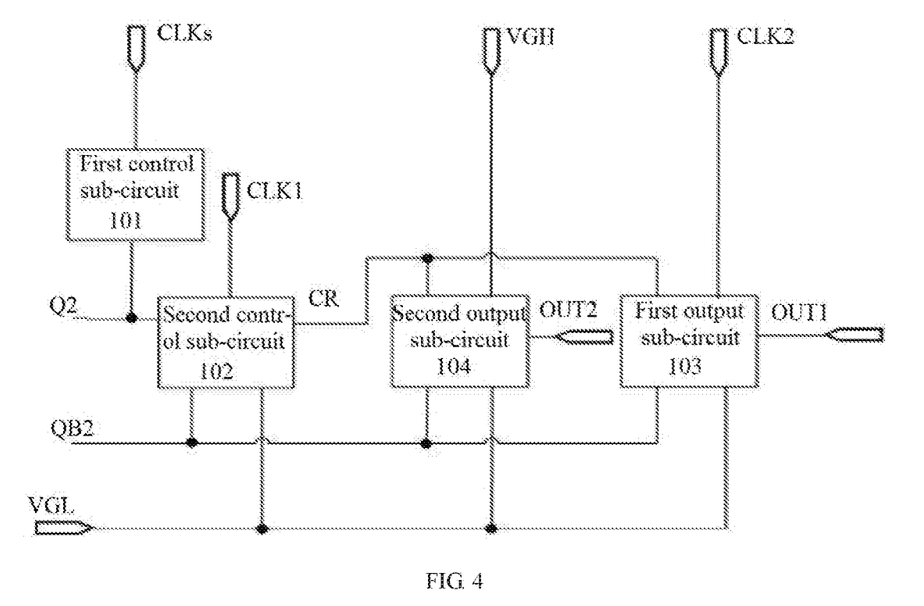
FIG. 4 illustrates a schematic structural block diagram of a gate drive output stage circuit according to an embodiment of the present disclosure.

FIG. 4 illustrates a schematic structural block diagram of a gate drive output stage circuit according to an embodiment of the present disclosure. As shown in FIG. 4, the gate drive output stage circuit includes:

a first control sub-circuit 101, configured to transmit a start signal CKLs of a compensation driving terminal to a first node Q2;

a second control sub-circuit 102, configured to transmit a first clock signal CLK1 of a first clock terminal to a control node CR when the first node Q2 is at an effective level;

a first output sub-circuit 103, configured to transmit a second clock signal CLK2 of a second clock terminal to a first output terminal OUT1 when the control node CR is at an effective level; and a second output sub-circuit 104, configured to transmit a first power supply voltage signal VGH of a first power supply voltage terminal to a second output terminal OUT2 when the control node CR is at the effective level.

As can be seen, in the present disclosure, one clock CLK3 is reduced by way of controlling the output of the first output sub-circuit and the output of the second output sub-circuit based on the output of the second control sub-circuit, which is advantageous when implementing a narrow bezel.

Figure 5:
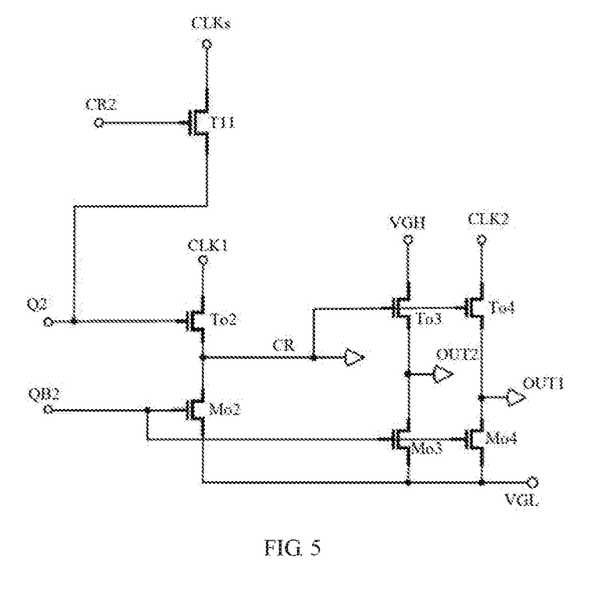
FIG. 5 illustrates a schematic diagram of an exemplary circuit of a gate drive output stage circuit according to an embodiment of the present disclosure.

FIG. 5 illustrates a schematic diagram of an exemplary circuit of a gate drive output stage circuit according to an embodiment of the present disclosure.

As shown in FIG. 5, the first control sub-circuit 101 includes:

a first control transistor T11, a first electrode of the first control transistor T11 being coupled to the compensation driving terminal, a second electrode of the first control transistor T11 being coupled to the first node Q2, and the first control transistor T11 being configured to be turned on before the start signal CLKs is valid.

Under the action of the start signal CLKs as compensation start signal, the output of the OUT1 and OUT2 is allowed to be valid.

The second control sub-circuit 102 includes:

a second control transistor To2, a gate of the second control transistor To2 being coupled to the first node Q2, a first electrode of the second control transistor To2 being coupled to the first clock terminal, and a second electrode of the second control transistor To2 being coupled to the control node CR; and a third control transistor Mo2, a gate of the third control transistor Mo2 being coupled to a second node QB2, a first electrode of the third control transistor Mo2 being coupled to the control node CR, and a second electrode of the third control transistor Mo2 being coupled to a second power supply voltage terminal, wherein the second node QB2 is an opposite node of the first node Q2.

The first output sub-circuit 103 includes:

a first output transistor To4, a gate of the first output transistor To4 being coupled to the control node CR, a first electrode of the first output transistor To4 being coupled to the second clock terminal, and a second electrode of the first output transistor To4 being coupled to the first output terminal; and a second output transistor Mo4, a gate of the second output transistor Mo4 being coupled to the second node QB2, a first electrode of the second output transistor Mo4 being coupled to the first output terminal, and a second electrode of the second output transistor Mo4 being coupled to the second power supply voltage terminal.

The second output sub-circuit 104 includes:

a third output transistor To3, a gate of the third output transistor To3 being coupled to the control node CR, a first electrode of the third output transistor To3 being coupled to the first power supply voltage terminal, and a second electrode of the third output transistor To3 being coupled to the second output terminal; and a fourth output transistor Mo3, a gate of the fourth output transistor Mo3 being coupled to the second node QB2, a first electrode of the fourth output transistor Mo3 being coupled to the second output terminal, and a second electrode of the fourth output transistor Mo3 being coupled to the second power supply voltage terminal.

The gate drive output stage circuit works as follows. A clock CLKs is configured to generate a start signal for driving a clock signal in the blanking interval. When CR2 is an enable signal, the first control transistor T11 is turned on, and a high voltage is written into the first node Q2 by a high voltage pulse through the CLKs. At this moment, the CLK1 is at a low level (referring to the blanking interval in FIG. 6), the start signal CLKs become from a high level to a low level, and the first node Q2 remains at the high level, and the CR is at a low level at this moment. When the first clock signal CLK1 becomes from a low level to a high level, the second control transistor To2 outputs the control signal CR as the high voltage of the first clock signal CLK1, and the third output transistor To3 and the first output transistor To4 are turned on. The third output transistor To3 is turned on to output VGH, and the first output transistor To4 is turned on to output CLK2. At this moment, the required OUT2 may be outputted only by adjusting a timing sequence of CLK2.

Figure 6:
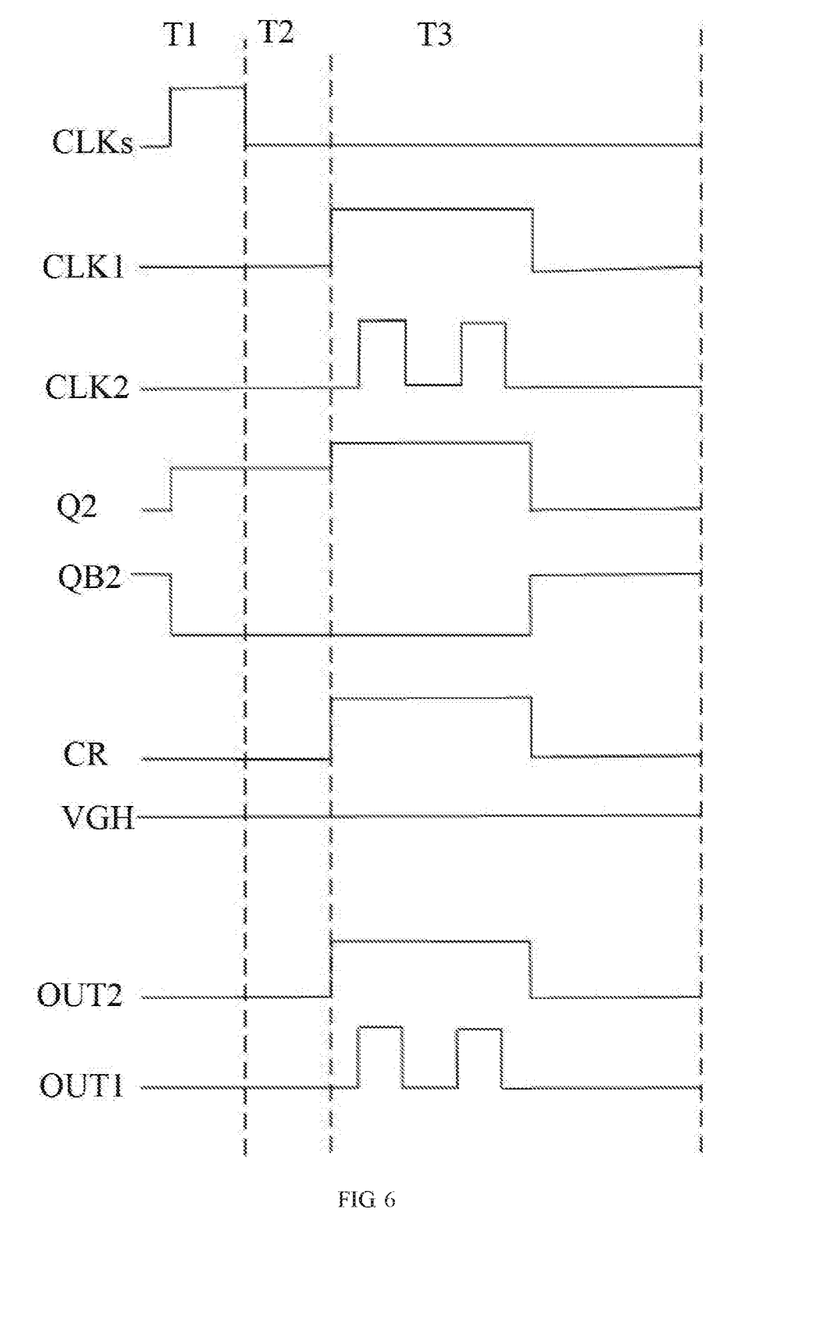
FIG. 6 illustrates a schematic timing chart of a gate drive output stage circuit according to an embodiment of the present disclosure.

FIG. 6 illustrates a schematic timing chart of a gate drive output stage circuit according to an embodiment of the present disclosure. As shown in FIG. 6, the timing sequence of the output stage circuit includes three phases, i.e., T1, T2, and T3.

In the first phase T1, the first node Q2 is pulled up under the action of the start signal CLKs, whereas the second node QB2 is pulled down under the action of the inverter.

In the second phase T2, the start signal CLKs becomes from a high level to a low level, the first node Q2 remains at the high level, and the control node CR is at a low level at this moment.

In the third phase T3, under the action of the first node Q2, the first control transistor To2 is turned on to transmit the first clock signal CLK1 to the control node CR, and the first node Q2 is further pulled up under the action of the first clock signal CLK1. In the meanwhile, under the action of the control node CR, the third output transistor To3 is turned on to transmit the first power supply voltage signal VGH to the first output terminal. Under the action of the control node CR, the first output transistor To4 transmits the second clock signal CLK2 to the second output terminal.

The present disclosure also provides a gate driving unit.

Figure 7:
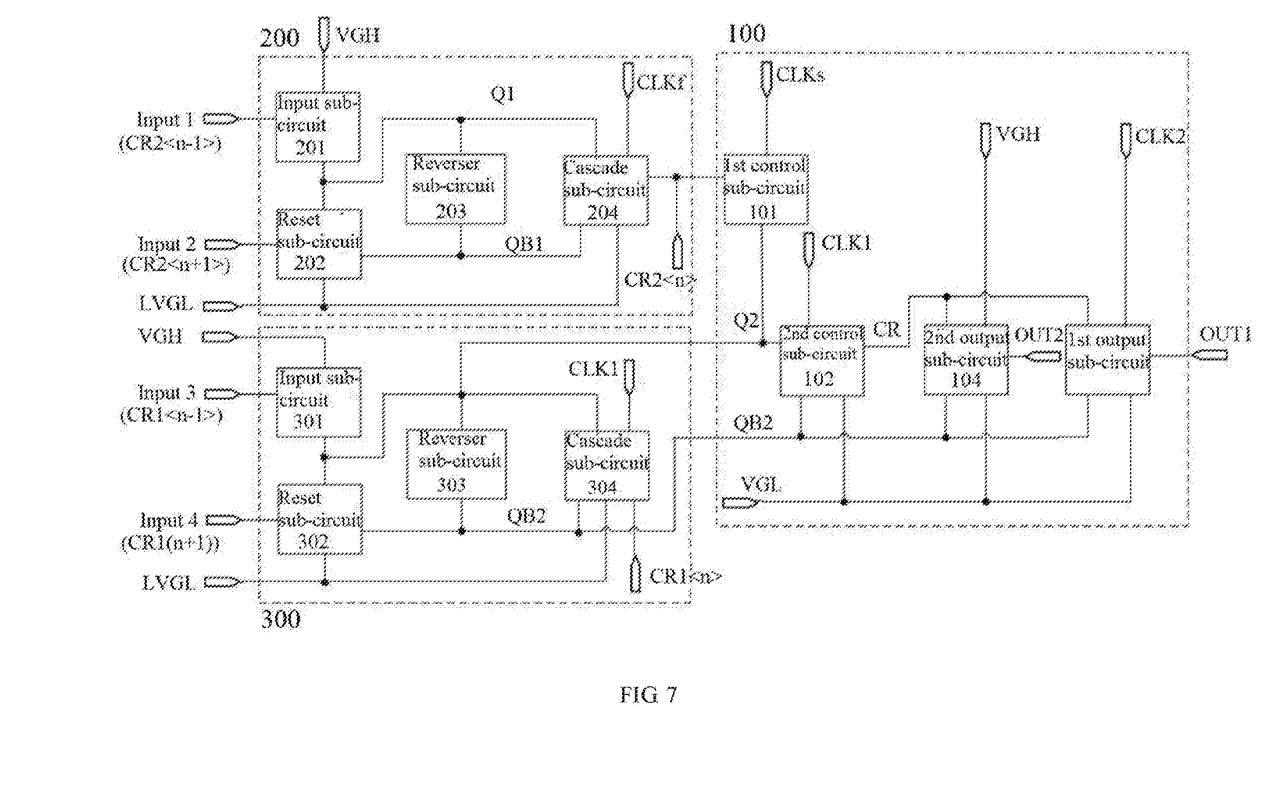
FIG. 7 illustrates a schematic structural block diagram of a gate driving unit according to an embodiment of the present disclosure.

FIG. 7 illustrates a schematic structural block diagram of a gate driving unit according to an embodiment of the present disclosure. As shown in FIG. 7, the gate driving unit includes:

the gate drive output stage circuit 100 provided by the embodiment of the present disclosure; and a shift register circuit 200 for frame shifting and a shift register circuit 300 for row shifting which have an identical structure.

The shift register circuit 200 includes:

an input sub-circuit 201, configured to receive a cascade signal Input1 from a previous-stage gate driving unit, and pull the third node Q1 to be equal to the voltage VGH of the first power supply voltage terminal under the action of the cascade signal CR2<n-1> from the previous-stage gate driving unit;

a reset sub-circuit 202, configured to receive a cascade signal Input2 from a next-stage gate driving unit, and reset under the action of the cascade signal CR2<n+1> from the next-stage gate driving unit;

a reverser sub-circuit 203, two ends of the reverser sub-circuit 203 being respectively coupled to the third node Q1 and a fourth node QB1; and a cascade output sub-circuit 204, configured to transmit a third clock signal CLKf of a third clock terminal to the cascade output terminal when the third node Q1 is at an effective level.

The cascade output terminal of the shift register circuit 200 for frame shifting is coupled to a gate of the first control transistor T11 of the gate drive output stage circuit, and the third node and the fourth node of the shift register circuit 300 for row shifting are respectively coupled to the first node Q2 and the second node QB2 of the gate drive output stage circuit.

A third clock terminal of the shift register circuit 300 for row shifting receives the same clock signal CLK2 as the first clock terminal of the gate drive output stage circuit 100.

The previous-stage output CR2<n-1> of the cascade output CR2 of the shift register circuit 200 serves as the first input Input1 of this stage, and the next-stage output CR2<n+1> serves as the second input Input2 of this stage. In this regard, a shift register for frame shifting is formed.

The previous-stage output CR1<n-1> of the cascade output CR1 of the shift register circuit 300 serves as the third input Input3 of this stage, and the next-stage output CR1<n+1> serves as the fourth input Input4 of this stage. In this regard, a shift register for row shifting is formed.

The cascade output CR2 of this stage also serves as a signal of the first control transistor of the first control sub-circuit to launch a current compensation in the blanking interval between frames.

Figure 8:
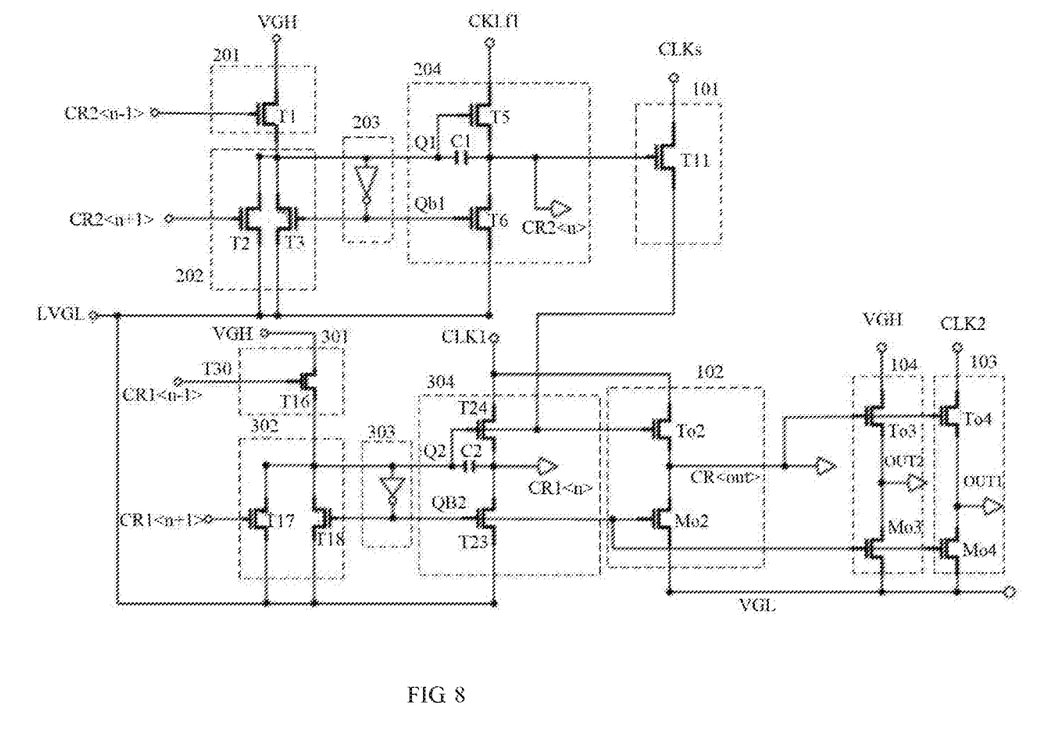
FIG. 8 illustrates a schematic diagram of an exemplary circuit of a gate driving unit according to an embodiment of the present disclosure.

FIG. 8 illustrates a schematic diagram of an exemplary circuit of a gate driving unit according to an embodiment of the present disclosure. As shown in FIG. 8, the input sub-circuit 201 includes:

a first input transistor T1, a gate of the first input transistor T1 being coupled to the cascade output terminal of the previous-stage gate driving unit, a first electrode of the first input transistor T1 being coupled to the first power supply voltage terminal, and a second electrode of the first input transistor T1 being coupled to the third node Q1.

When the cascade signal CR2<n-1> from the cascade output terminal of the previous-stage gate driving unit is valid, the first input transistor T1 is turned on, and the voltage of the third node Q1 is pulled to be equal to the first power supply voltage signal VGH of the first power supply voltage terminal.

The reset sub-circuit 202 includes:

a first reset transistor T2, a gate of the first reset transistor T2 being coupled to the cascade output terminal of the next-stage gate driving unit, a first electrode of the first reset transistor T2 being coupled to the third node Q1, and a second electrode of the first reset transistor T2 being coupled to the third power supply voltage terminal;

a second reset transistor T3, a gate of the second reset transistor T3 being coupled to the fourth node QB1, a first electrode of the second reset transistor T3 being coupled to the third node Q1, and a second electrode of the second reset transistor T3 being coupled to the third power supply voltage terminal.

When the cascade signal CR2<n+1> from the cascade output terminal of the next-stage gate driving unit is valid, the first reset transistor T2 is turned on, and the voltage of the third node Q1 is pulled to be equal to the voltage of the third power supply voltage signal LVGL of the third power supply voltage terminal. At this moment, a second cascade transistor T6 is turned on to pull the cascade output CR2 to be equal to the voltage of the third power supply voltage signal LVGL. In this regard, resetting of this stage when the next-stage cascade signal is valid may be implemented.

The gate of the second reset transistor T3 is coupled to the fourth node QB1, such that the third node Q1 can maintain a low voltage when the first cascade transistor T5 does not work, to play a role in noise suppression.

The cascade output sub-circuit 204 includes:

a first cascade transistor T5, a gate of the first cascade transistor T5 being coupled to the third node Q1, a first electrode of the first cascade transistor T5 being coupled to the third clock terminal, and a second electrode of the first cascade transistor T5 being coupled to the cascade output terminal;

a second cascade transistor T6, a gate of the second cascade transistor T6 being coupled to the fourth node QB1, a first electrode of the second cascade transistor T6 being coupled to the cascade output terminal, and a second electrode of the second cascade transistor T6 being coupled to the third power supply voltage terminal; and a first energy storage capacitor C1, a first electrode of the first energy storage capacitor C1 being coupled to the third node Q1, and a second electrode of the first energy storage capacitor C1 being coupled to the cascade output terminal.

When the cascade output signal CR<n−1> of the previous-stage gate driving unit is valid, the third node Q1 is pulled to be equal to the voltage VGH. At this moment, the first cascade transistor T5 is turned on to transmit the third clock signal CLKf to the cascade output terminal, such that a valid signal CR2<n> is outputted. At this moment, the first control transistor T11 is turned on to transmit the start signal CLKs to the first node Q2 to launch the current compensation for the electroluminescent (EL) device. Meanwhile, the signal CR2<n> also serves as an enable signal of the first input transistor of the next-stage gate driving unit, and functions as a cascade signal.

Figure 9:
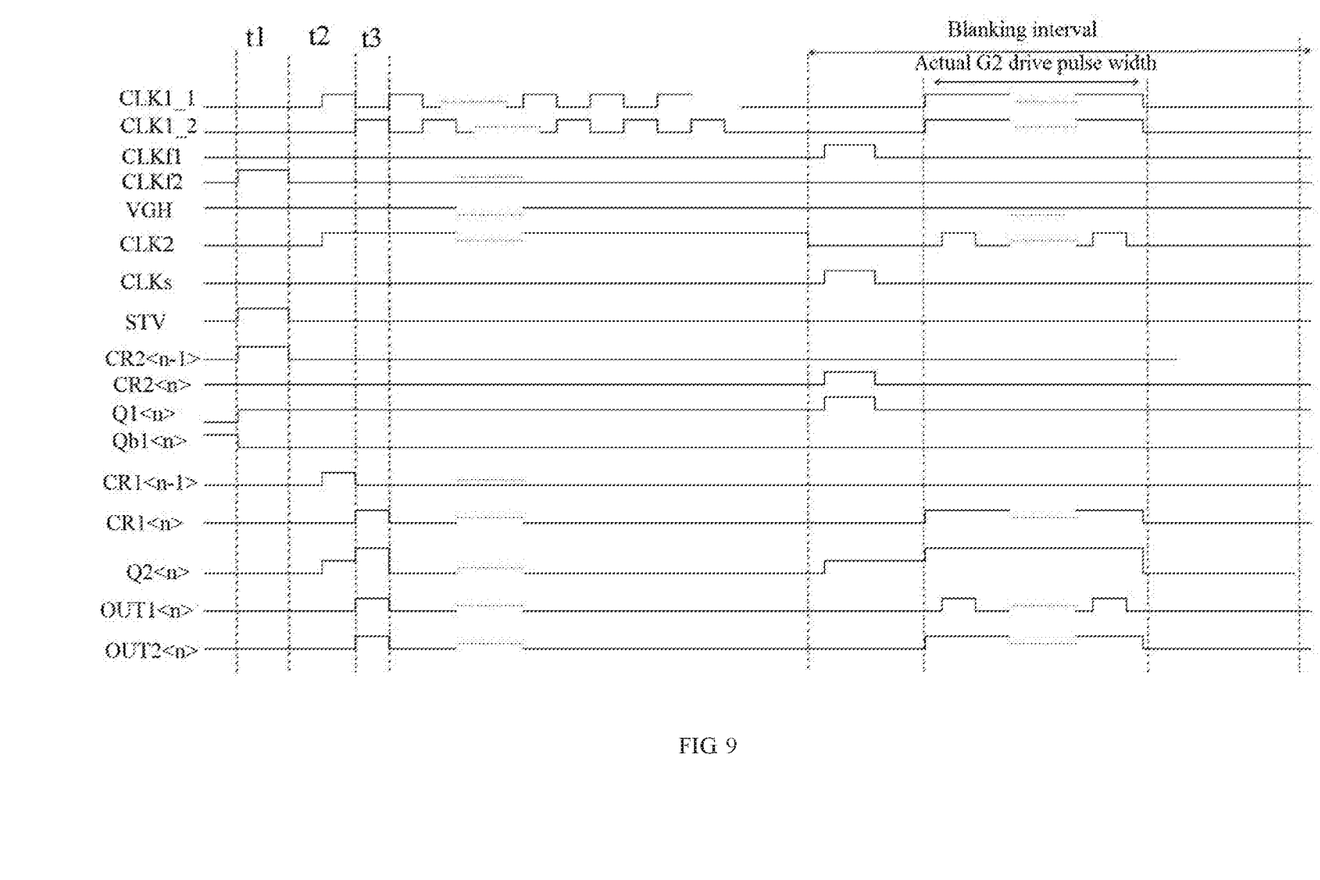
FIG. 9 illustrates a schematic timing chart of a gate driving unit according to an embodiment of the present disclosure.

FIG. 9 illustrates a schematic timing chart of a gate driving unit according to an embodiment of the present disclosure.

As shown in FIG. 9, the timing sequence when the gate driving unit of the present disclosure displays a frame includes phases such as T1, T2, and T3, etc.

In the first phase t1, under the action of the signal CR2<n−1>, the third node Q1 is pulled up, whereas the fourth node QB1 is pulled down under the action of the inverter.

In the second phase t2, the first node Q2 is pulled up under the action of the signal CR1<n−2>.

In the third phase t3, under the action of CLK1_2, the first node Q2 is further pulled up, and the corresponding signals OUT1 and OUT2 are outputted in the valid phase of CLK1_2.

As can be seen, the above gate driving circuit does not affect its normal output in the frame display phase. The output signals OUT1 and OUT2 for compensating the light emission current of the electroluminescent device can be outputted in the blank phase.

The flowcharts and block diagrams in the figures illustrate architectures, functions, and operations that may be implemented according to the system, the method, and the computer program product of the various embodiments of the present disclosure. In this regard, each block in the flow charts and block diagrams may represent a module, a program segment, or a code portion. The module, the program segment, or the code portion comprises one or more executable instructions for implementing the specified logical function. It should be noted that, in some alternative implementations, the functions denoted by the blocks may occur in a sequence different from the sequences shown in the figures. For example, in practice, two blocks in succession may be executed, depending on the involved functionalities, substantially in parallel, or in a reverse sequence. It should also be noted that, each block in the block diagrams and/or the flow charts and/or a combination of the blocks may be implemented by a dedicated hardware-based system executing specific functions or operations, or by a combination of a dedicated hardware and computer instructions.

The foregoing is only a description of the preferred embodiments of the present disclosure and the applied technical principles. It should be appreciated by those skilled in the art that the inventive scope of the present disclosure is not limited to the technical solutions formed by the particular combinations of the above technical features. The inventive scope should also cover other technical solutions formed by any combinations of the above technical features, or equivalent features thereof, without departing from the concept of the invention, such as, technical solutions formed by replacing the features as disclosed in the present disclosure with (but not limited to), technical features with similar functions.

What is claimed is:

1. A gate drive output stage circuit, comprising:
   a first control sub-circuit configured to transmit a start signal of a compensation driving terminal to a first node;
   a second control sub-circuit configured to transmit a first clock signal of a first clock terminal to a control node when the first node is at an effective level;
   a first output sub-circuit configured to transmit a second clock signal of a second clock terminal to a first output terminal when the control node is at an effective level; and
   a second output sub-circuit configured to transmit a first power supply voltage signal of a first power supply voltage terminal to a second output terminal when the control node is at the effective level.

2. The gate drive output stage circuit according to claim 1, wherein the first control sub-circuit comprises: a first control transistor, a first electrode of the first control transistor being coupled to the compensation driving terminal, and a second electrode of the first control transistor being coupled to the first node, and the first control transistor being configured to be turned on before the start signal is valid.

3. The gate drive output stage circuit according to claim 2, wherein the second control sub-circuit comprises:
   a second control transistor, a gate of the second control transistor being coupled to the first node, a first electrode of the second control transistor being coupled to the first clock terminal, and a second electrode of the second control transistor being coupled to the control node; and
   a third control transistor, a gate of the third control transistor being coupled to a second node, a first electrode of the third control transistor being coupled to the control node, and a second electrode of the third control transistor being coupled to a second power supply voltage terminal, wherein the second node is an opposite node of the first node.

4. The gate drive output stage circuit according to claim 3, wherein the first output sub-circuit comprises:
   a first output transistor, a gate of the first output transistor being coupled to the control node, a first electrode of the first output transistor being coupled to the second clock terminal, and a second electrode of the first output transistor being coupled to the first output terminal; and
   a second output transistor, a gate of the second output transistor being coupled to the second node, a first electrode of the second output transistor being coupled to the first output terminal, and a second electrode of the second output transistor being coupled to the second power supply voltage terminal.

5. The gate drive output stage circuit according to claim 4, wherein the second output sub-circuit comprises:
   a third output transistor, a gate of the third output transistor being coupled to the control node, a first electrode of the third output transistor being coupled to the first power supply voltage terminal, and a second electrode of the third output transistor being coupled to the second output terminal; and
   a fourth output transistor, a gate of the fourth output transistor being coupled to the second node, a first electrode of the fourth output transistor being coupled to the second output terminal, and a second electrode of the fourth output transistor being coupled to the second power supply voltage terminal.

6. The gate drive output stage circuit according to claim 1, wherein the second clock signal comprises two pulses within one pulse interval of the first clock signal.

7. A gate driving unit, comprising:
a gate drive output stage circuit; and
a first shift register circuit for frame shifting and a second shift register circuit for row shifting each of which having an identical structure, wherein the gate drive output stage circuit comprises:
  a first control sub-circuit configured to transmit a start signal of a compensation driving terminal to a first node;
  a second control sub-circuit configured to transmit a first clock signal of a first clock terminal to a control node when the first node is at an effective level;
  a first output sub-circuit configured to transmit a second clock signal of a second clock terminal to a first output terminal when the control node is at an effective level; and
  a second output sub-circuit configured to transmit a first power supply voltage signal of a first power supply voltage terminal to a second output terminal when the control node is at the effective level, wherein each of the first shift register circuit and the second shift register circuit comprises:
    an input sub-circuit configured to receive a cascade signal from a previous-stage gate driving unit and pull a third node to be equal to a voltage of the first power supply voltage terminal under the action of the cascade signal from the previous-stage gate driving unit;
    a reset sub-circuit configured to receive a cascade signal from a next-stage gate driving unit and reset under the action of the cascade signal from the next-stage gate driving unit;
    a reverser sub-circuit, two ends of the reverser sub-circuit being respectively coupled to the third node and a fourth node; and
    a cascade output sub-circuit configured to transmit a third clock signal of a third clock terminal to a cascade output terminal when the third node is at an effective level;
  wherein the cascade output terminal of the first shift register circuit for frame shifting is coupled to a gate of a first control transistor of the gate drive output stage circuit, and the third node and the fourth node of the second shift register circuit for row shifting are respectively coupled to the first node and a second node of the gate drive output stage circuit; and
  wherein the third clock terminal of the second shift register circuit for row shifting receives a same clock signal as the first clock terminal of the gate drive output stage circuit.

8. The gate driving unit according to claim 7, wherein the input sub-circuit comprises a first input transistor, a gate of the first input transistor being coupled to the cascade output terminal of the previous-stage gate driving unit, a first electrode of the first input transistor being coupled to the first power supply voltage terminal, and a second electrode of the first input transistor being coupled to the third node.

9. The gate driving unit according to claim 8, wherein the reset sub-circuit comprises:
a first reset transistor, a gate of the first reset transistor being coupled to the cascade output terminal of the next-stage gate driving unit, a first electrode of the first reset transistor being coupled to the third node, and a second electrode of the first reset transistor being coupled to a third power supply voltage terminal; and
a second reset transistor, a gate of the second reset transistor being coupled to the fourth node, a first electrode of the second reset transistor being coupled to the third node, and a second electrode of the second reset transistor being coupled to the third power supply voltage terminal.

10. The gate driving unit according to claim 9, wherein the cascade output sub-circuit comprises:
a first cascade transistor, a gate of the first cascade transistor being coupled to the third node, a first electrode of the first cascade transistor being coupled to the third clock terminal, and a second electrode of the first cascade transistor being coupled to the cascade output terminal;
a second cascade transistor, a gate of the second cascade transistor being coupled to the fourth node, a first electrode of the second cascade transistor being coupled to the cascade output terminal, and a second electrode of the second cascade transistor being coupled to the third power supply voltage terminal; and
a first energy storage capacitor, a first electrode of the first energy storage capacitor being coupled to the third node, and a second electrode of the first energy storage capacitor being coupled to the cascade output terminal.

11. The gate driving unit according to claim 7, wherein a third clock signal of the first shift register circuit for frame shifting is a frame shifting clock signal, and a third clock signal of the second shift register circuit for row shifting is a row shifting clock signal.

12. The gate driving unit according to claim 7, wherein the first control sub-circuit comprises: the first control transistor, a first electrode of the first control transistor being coupled to the compensation driving terminal, and a second electrode of the first control transistor being coupled to the first node, and the first control transistor being configured to be turned on before the start signal is valid.

13. The gate driving unit according to claim 12, wherein the second control sub-circuit comprises:
a second control transistor, a gate of the second control transistor being coupled to the first node, a first electrode of the second control transistor being coupled to the first clock terminal, and a second electrode of the second control transistor being coupled to the control node; and
a third control transistor, a gate of the third control transistor being coupled to a second node, a first electrode of the third control transistor being coupled to the control node, and a second electrode of the third control transistor being coupled to a second power supply voltage terminal, wherein the second node is an opposite node of the first node.

14. The gate driving unit according to claim 13, wherein the first output sub-circuit comprises:
a first output transistor, a gate of the first output transistor being coupled to the control node, a first electrode of the first output transistor being coupled to the second clock terminal, and a second electrode of the first output transistor being coupled to the first output terminal; and
a second output transistor, a gate of the second output transistor being coupled to the second node, a first electrode of the second output transistor being coupled to the first output terminal, and a second electrode of the second output transistor being coupled to the second power supply voltage terminal.

15. The gate driving unit according to claim 14, wherein the second output sub-circuit comprises:
- a third output transistor, a gate of the third output transistor being coupled to the control node, a first electrode of the third output transistor being coupled to the first power supply voltage terminal, and a second electrode of the third output transistor being coupled to the second output terminal; and
- a fourth output transistor, a gate of the fourth output transistor being coupled to the second node, a first electrode of the fourth output transistor being coupled to the second output terminal, and a second electrode of the fourth output transistor being coupled to the second power supply voltage terminal.

16. The gate driving unit according to claim 7, wherein the second clock signal comprises two pulses within one pulse interval of the first clock signal.

17. A drive method of a gate drive output stage circuit, comprising:
- in a first phase, pulling up a first node by a first control sub-circuit under an action of a start signal;
- in a second phase, transmitting, by a second control sub-circuit, a first clock signal to a control node under the action of the first node; and
- in a third phase, transmitting, by a first output sub-circuit, a first power supply voltage signal to a first output terminal under the action of the control node, and transmitting, by a second output sub-circuit, a second clock signal to a second output terminal under the action of the control node.

18. The drive method according to claim 17, wherein the second clock signal comprises two pulses within one pulse interval of the first clock signal.

* * * * *